United States Patent
Li et al.

(10) Patent No.: US 8,775,898 B2
(45) Date of Patent: Jul. 8, 2014

(54) SYSTEMS AND METHODS FOR HARDWARE FLEXIBLE LOW DENSITY PARITY CHECK CONVERSION

(75) Inventors: Zongwang Li, Dublin, CA (US); Shaohua Yang, Santa Clara, CA (US)

(73) Assignee: LSI Corporation, San Jose, CA (US)

( * ) Notice: Subject to any disclaimer, the term of this patent is extended or adjusted under 35 U.S.C. 154(b) by 282 days.

(21) Appl. No.: 13/474,664

(22) Filed: May 17, 2012

(65) Prior Publication Data

US 2013/0311846 A1    Nov. 21, 2013

(51) Int. Cl.
*H03M 13/00* (2006.01)
*G06F 11/00* (2006.01)
*H03M 13/11* (2006.01)
*H03M 13/25* (2006.01)

(52) U.S. Cl.
CPC .......... *H03M 13/116* (2013.01); *H03M 13/255* (2013.01)
USPC .......................................... 714/758; 714/801

(58) Field of Classification Search
USPC .......... 714/758, 752, 786, 746, 799, 800, 801
See application file for complete search history.

(56) References Cited

U.S. PATENT DOCUMENTS

| | | | |
|---|---|---|---|
| 5,701,314 A | 12/1997 | Armstrong | |
| 5,712,861 A | 1/1998 | Inoue | |
| 6,438,717 B1 | 8/2002 | Butler | |
| 6,657,803 B1 | 12/2003 | Ling | |
| 7,136,244 B1 | 11/2006 | Rothberg | |
| 7,702,989 B2 | 4/2010 | Graef | |
| 7,730,384 B2 | 6/2010 | Graef | |
| 7,738,201 B2 | 6/2010 | Jin | |
| 7,913,149 B2 * | 3/2011 | Gribok et al. | 714/781 |
| 7,971,125 B2 | 6/2011 | Graef | |
| 7,990,642 B2 | 8/2011 | Lee | |
| 8,176,404 B2 | 5/2012 | Yang | |
| 8,316,287 B1 * | 11/2012 | Varnica et al. | 714/801 |
| 8,473,806 B1 * | 6/2013 | Rad et al. | 714/752 |
| 8,489,962 B2 * | 7/2013 | Dielissen | 714/758 |
| 2011/0080211 A1 | 4/2011 | Yang | |
| 2011/0161633 A1 | 6/2011 | Xu | |
| 2012/0200954 A1 | 8/2012 | Jin | |
| 2012/0236429 A1 | 9/2012 | Yang | |

OTHER PUBLICATIONS

Olmos et al., "Tree-Structure Expectation Propagation for LDPC Decoding in Erasure Channels", Cornell University Library arXiv:1009.4287 (Sep. 22, 2010).
U.S. Appl. No. 13/459,282, filed Apr. 30, 2012, Fan Zhang, Unpublished.
U.S. Appl. No. 13/445,858, filed Apr. 12, 2012, Johnson Yen, Unpublished.
U.S. Appl. No. 13/412,492, filed Mar. 5, 2012, Shaohua Yang, Unpublished.
U.S. Appl. No. 13/326,367, filed Dec. 15, 2011, Shaohua Yang, Unpublished.
U.S. Appl. No. 13/372,600, filed Feb. 14, 2012, Shaohua Yang, Unpublished.
U.S. Appl. No. 13/326,363, filed Dec. 15, 2011, Fan Zhang, Unpublished.
U.S. Appl. No. 13/465,214, filed May 7, 2012, Chung-Li Wang, Unpublished.

* cited by examiner

*Primary Examiner* — Christine Tu
(74) *Attorney, Agent, or Firm* — Hamilton DeSanctis & Cha

(57) ABSTRACT

The present inventions are related to systems and methods for data processing, and more particularly to systems and methods for data encoding.

20 Claims, 6 Drawing Sheets

$$300 \diagdown \begin{bmatrix} P_{1,1} & P_{1,2} & \cdots & P_{1,j} & \cdots & P_{1,L} \\ P_{2,1} & P_{2,2} & \cdots & P_{2,j} & \cdots & P_{2,L} \\ P_{3,1} & P_{3,2} & \cdots & P_{3,j} & \cdots & P_{3,L} \end{bmatrix}$$

$$305 \diagdown$$

$$P_{i,j} = \begin{bmatrix} 0 & \alpha & 0 & \cdots & 0 \\ 0 & 0 & \alpha & \cdots & 0 \\ \vdots & \vdots & \vdots & & \vdots \\ 0 & 0 & 0 & \cdots & \alpha \\ \alpha & 0 & 0 & \cdots & 0 \end{bmatrix}$$

$$\text{Original } P_{i,j} = \begin{bmatrix} 0 & \alpha & 0 & 0 \\ 0 & 0 & \alpha & 0 \\ 0 & 0 & 0 & \alpha \\ \alpha & 0 & 0 & 0 \end{bmatrix}$$

400

⇓

$$\text{Row Permutation } P_{i,j} = \begin{bmatrix} 0 & \alpha & 0 & 0 \\ 0 & 0 & 0 & \alpha \\ 0 & 0 & \alpha & 0 \\ \alpha & 0 & 0 & 0 \end{bmatrix}$$

420

⇓

$$\text{Column Permutation } P_{i,j} = \left[ \begin{array}{cc|cc} 0 & 0 & \alpha & 0 \\ 0 & 0 & 0 & \alpha \\ \hline 0 & \alpha & 0 & 0 \\ \alpha & 0 & 0 & 0 \end{array} \right]$$

Original $P_{i,j}$ = $\begin{bmatrix} 0 & \alpha & 0 & 0 & 0 & 0 \\ 0 & 0 & 0 & 0 & \alpha & 0 \\ 0 & 0 & \alpha & 0 & 0 & 0 \\ 0 & 0 & 0 & 0 & 0 & \alpha \\ \alpha & 0 & 0 & 0 & 0 & 0 \end{bmatrix}$

550

Column Permutation $P_{i,j}$ = $\begin{bmatrix} 0 & 0 & 0 & \alpha & 0 & 0 \\ 0 & \alpha & 0 & 0 & 0 & 0 \\ 0 & 0 & 0 & 0 & \alpha & 0 \\ 0 & 0 & \alpha & 0 & 0 & 0 \\ 0 & 0 & 0 & 0 & 0 & \alpha \\ \alpha & 0 & 0 & 0 & 0 & 0 \end{bmatrix}$

560

Divisible Circulant $P_{i,j}$ = $\begin{bmatrix} \begin{array}{ccc|ccc} 0 & 0 & 0 & \alpha & 0 & 0 \\ 0 & 0 & 0 & 0 & \alpha & 0 \\ \underline{552} & & & \underline{554} & & \\ 0 & 0 & 0 & 0 & 0 & \alpha \\ \hline 0 & \alpha & 0 & 0 & 0 & 0 \\ 0 & 0 & \alpha & 0 & 0 & 0 \\ \underline{556} & & & \underline{558} & & \\ \alpha & 0 & 0 & 0 & 0 & 0 \end{array} \end{bmatrix}$

SYSTEMS AND METHODS FOR HARDWARE FLEXIBLE LOW DENSITY PARITY CHECK CONVERSION

BACKGROUND OF THE INVENTION

The present inventions are related to systems and methods for data processing, and more particularly to systems and methods for data encoding.

Various storage systems include data processing circuitry implemented with a data decoding circuit. In some cases, the data decoding circuit operates on a very large codeword that includes a number of parity bits. As a general rule, the performance of the data decoding circuit is increased where more circuitry is used to implement the circuit. In some cases, the performance of the data decoding circuit is insufficient, and at the same time the power and die space required to improve the performance is not available.

Hence, for at least the aforementioned reasons, there exists a need in the art for advanced systems and methods for data processing.

BRIEF SUMMARY OF THE INVENTION

The present inventions are related to systems and methods for data processing, and more particularly to systems and methods for data encoding.

Various embodiments of the present invention provide data encoding systems that include a data encoder circuit and a codeword conversion circuit. The data encoder circuit is operable to apply an encoding algorithm to a data set to yield an initial codeword that includes at least one initial circulant. The codeword conversion circuit is operable to rearrange elements of the initial circulant to yield a divisible circulant including a selected number of sub-circulants, and to reform the initial codeword to include the divisible circulant to yield a converted codeword. In some cases, the selected number of sub-circulants is programmable. In other cases, the selected number of sub-circulants is fixed. In various cases, the encoding algorithm is a low density parity check encoding algorithm.

In some instances of the aforementioned embodiments, the codeword conversion circuit is further operable to determine codeword permutation indices based at least in part on the selected number of sub-circulants. In some such instances, the codeword permutation indices are calculated in accordance with the following equation:

$$\text{Permutation Index}(i) = \mod(i,s) \ast (p/s) + \text{floor}(i/s), \text{ for } i=0 \text{ to } p-1,$$

where p is the size of the initial circulant, and s is the selected number of sub-circulants. In various of the aforementioned instances, rearranging the elements of the initial circulant to yield the divisible circulant including a selected number of sub-circulants is done by swapping rows of the initial circulant in accordance with the permutation indices to yield an interim data set. In some cases, rearranging the elements of the initial circulant to yield the divisible circulant including a selected number of sub-circulants further includes swapping columns of the interim data set in accordance with the permutation indices to yield the divisible circulant. In other of the aforementioned instances, rearranging the elements of the initial circulant to yield the divisible circulant including a selected number of sub-circulants is done by swapping columns of the initial circulant in accordance with the permutation indices to yield an interim data set. In some cases, rearranging the elements of the initial circulant to yield the divisible circulant including a selected number of sub-circulants further includes swapping rows of the interim data set in accordance with the permutation indices to yield the divisible circulant.

Other embodiments of the present invention provide methods for codeword conversion that include: applying a data encoding algorithm to a data set to yield an initial codeword that includes at least one initial circulant; rearranging elements of the initial circulant to yield a divisible circulant including a selected number of sub-circulants; and reforming the initial codeword to include the divisible circulant to yield a converted codeword. In some instances of the aforementioned embodiments, the methods further include determining codeword permutation indices based at least in part on the selected number of sub-circulants. In one or more of the aforementioned instances, rearranging the elements of the initial circulant to yield the divisible circulant including a selected number of sub-circulants is done by swapping rows of the initial circulant in accordance with the permutation indices to yield an interim data set. In some cases, rearranging the elements of the initial circulant to yield the divisible circulant including a selected number of sub-circulants further includes swapping columns of the interim data set in accordance with the permutation indices to yield the divisible circulant. In other of the aforementioned instances, rearranging the elements of the initial circulant to yield the divisible circulant including a selected number of sub-circulants is done by swapping columns of the initial circulant in accordance with the permutation indices to yield an interim data set. In some cases, rearranging the elements of the initial circulant to yield the divisible circulant including a selected number of sub-circulants further includes swapping rows of the interim data set in accordance with the permutation indices to yield the divisible circulant.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 4 graphically depicts an example codeword conversion that may be done in accordance with some embodiments of the present invention;

FIG. 5b graphically depicts an example codeword conversion that may be done in accordance with some embodiments of the present invention;

DETAILED DESCRIPTION OF THE INVENTION

The present inventions are related to systems and methods for data processing, and more particularly to systems and methods for data encoding.

Various embodiments of the present invention provide systems and methods for data processing. Such systems and methods rely on converting a standard codeword into a hardware flexible codeword. This hardware flexible codeword is divisible into multiple sub-circulants that can each be processed in parallel by a parallel data decoding circuit. Allowing such parallel processing in the data decoding circuit allows for a more flexible hardware implementation of the data decoding circuit.

Figure 1:
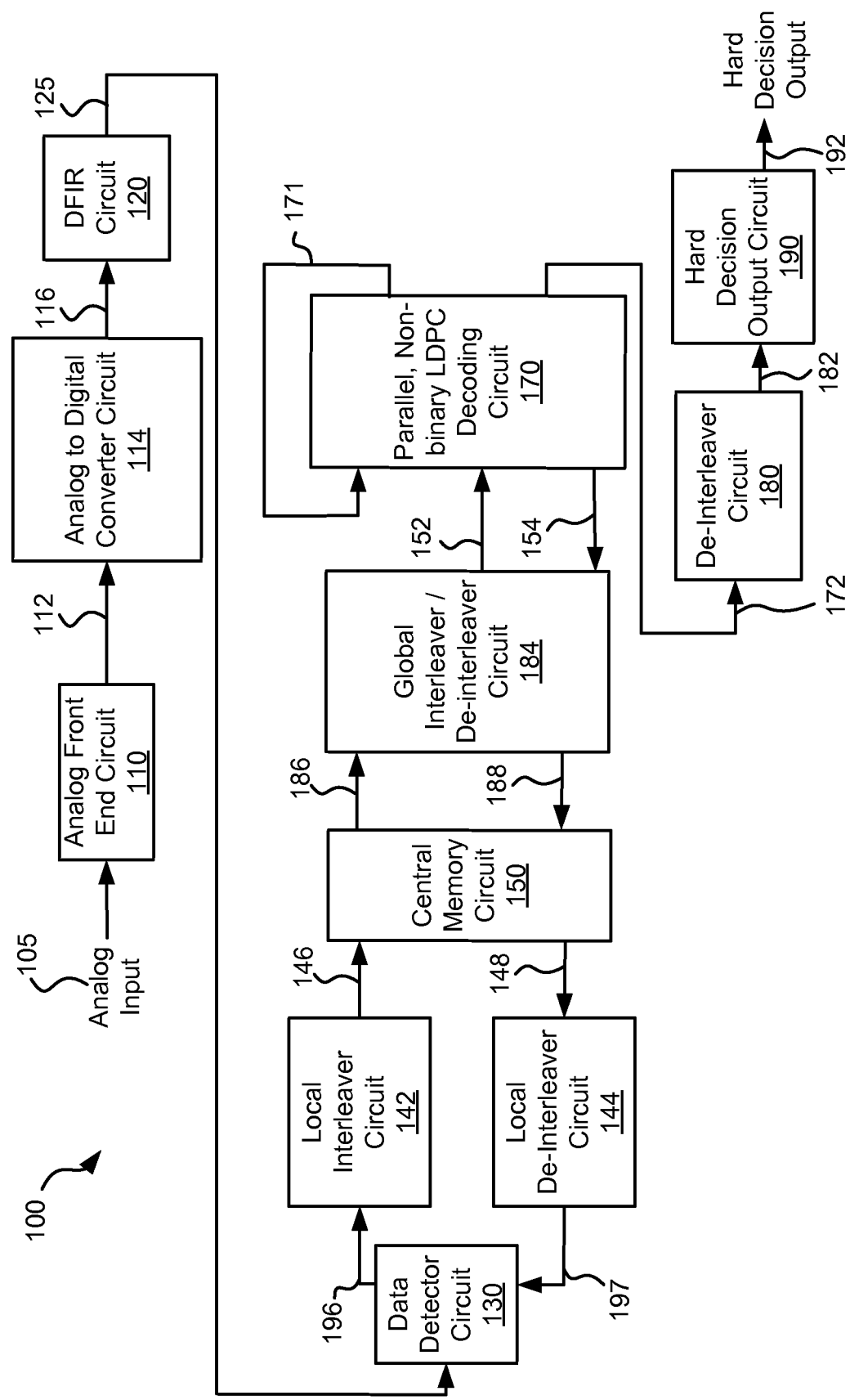
FIG. 1 shows a data processing circuit including a parallel non-binary LDCP decoding circuit in accordance with one or more embodiments of the present invention.
Figures 2, 3:
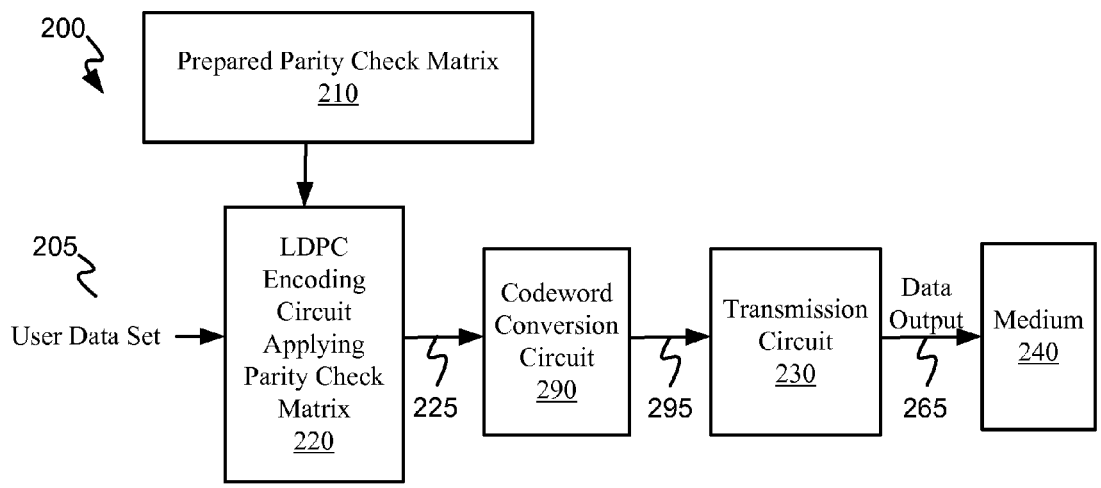
FIG. 2 depicts a data encoding circuit 200 including code conversion circuitry in accordance with various embodiments of the present invention.
FIG. 3 shows an example LDPC code and circulants that may be used in relation to various embodiments of the present invention.

Turning to FIG. 1, a data processing circuit 100 is shown that includes a parallel non-binary low density parity check (LDPC) decoding circuit 170 that is operable to utilize a hardware flexible codeword provided from an upstream encoder (see e.g., FIG. 2). Data processing circuit 100 includes an analog front end circuit 110 that receives an analog signal 105. Analog front end circuit 110 processes analog signal 105 and provides a processed analog signal 112 to an analog to digital converter circuit 114. Analog front end circuit 110 may include, but is not limited to, an analog filter and an amplifier circuit as are known in the art. Based upon the disclosure provided herein, one of ordinary skill in the art will recognize a variety of circuitry that may be included as part of analog front end circuit 110. In some cases, analog signal 105 is derived from a read/write head assembly (not shown) that is disposed in relation to a storage medium (not shown). In other cases, analog signal 105 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 105 may be derived.

Analog to digital converter circuit 114 converts processed analog signal 112 into a corresponding series of digital samples 116. Analog to digital converter circuit 114 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 116 are provided to an equalizer circuit 120. Equalizer circuit 120 applies an equalization algorithm to digital samples 116 to yield an equalized output 125. In some embodiments of the present invention, equalizer circuit 120 is a digital finite impulse response filter circuit as are known in the art. In some cases, equalizer 120 includes sufficient memory to maintain one or more codewords until a data detector circuit 130 is available for processing. It may be possible that equalized output 125 may be received directly from a storage device in, for example, a solid state storage system. In such cases, analog front end circuit 110, analog to digital converter circuit 114 and equalizer circuit 120 may be eliminated where the data is received as a digital data input.

Data detector circuit 130 is operable to apply a data detection algorithm to a received codeword or data set, and in some cases data detector circuit 130 can process two or more codewords in parallel. In some embodiments of the present invention, data detector circuit 130 is a Viterbi algorithm data detector circuit as are known in the art. In other embodiments of the present invention, data detector circuit 130 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Data detector circuit 130 is started based upon availability of a data set from equalizer circuit 120 or from a central memory circuit 150.

Upon completion, data detector circuit 130 provides detector output 196. Detector output 196 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 196 is provided to a local interleaver circuit 142. Local interleaver circuit 142 is operable to shuffle sub-portions (i.e., local chunks) of the data set included as detected output and provides an interleaved codeword 146 that is stored to central memory circuit 150. Interleaver circuit 142 may be any circuit known in the art that is capable of shuffling data sets to yield a re-arranged data set. Interleaved codeword 146 is stored to central memory circuit 150.

Once parallel non-binary LDPC decoding circuit 170 is available, a previously stored interleaved codeword 146 is accessed from central memory circuit 150 as a stored codeword 186 and globally interleaved by a global interleaver/de-interleaver circuit 184. Global interleaver/De-interleaver circuit 184 may be any circuit known in the art that is capable of globally rearranging codewords. Global interleaver/De-interleaver circuit 184 provides a decoder input 152 into parallel non-binary LDPC decoding circuit 170. Decoder input 152 is a hardware flexible codeword originally transferred by an encoder circuit (see e.g., FIG. 2). Parallel non-binary LDPC decoding circuit 170 is implemented to apply LDPC decoding to a number of sub-circulants in parallel where the sub-circulants represent an LDPC codeword. The sub-circulants are formed by an encoder circuit by converting an LDPC codeword as discussed below in relation to FIG. 2. Parallel non-binary LDPC decoding circuit 170 applies the data decode algorithm to decoder input 152 each time yielding a decoded output 171. For subsequent iterations, parallel non-binary LDPC decoding circuit 170 re-applies the data decode algorithm to decoder input 152 guided by decoded output 171.

Where decoded output 171 fails to converge (i.e., fails to yield the originally written data set) and a number of local iterations through parallel non-binary LDPC decoding circuit 170 exceeds a threshold, the resulting decoded output is provided as a decoded output 154 back to central memory circuit 150 where it is stored awaiting another global iteration through data detector circuit 130 and compression based data decoding circuit 170. Prior to storage of decoded output 154 to central memory circuit 150, decoded output 154 is globally de-interleaved to yield a globally de-interleaved output 188 that is stored to central memory circuit 150. The global de-interleaving reverses the global interleaving earlier applied to stored codeword 186 to yield decoder input 152. Once data detector circuit 130 is available, a previously stored de-interleaved output 188 is accessed from central memory circuit 150 and locally de-interleaved by a de-interleaver circuit 144. De-interleaver circuit 144 re-arranges decoder output 148 to reverse the shuffling originally performed by interleaver circuit 142. A resulting de-interleaved output 197 is provided to data detector circuit 130 where it is used to guide subsequent detection of a corresponding data set receive as equalized output 125.

Alternatively, where the decoded output converges (i.e., yields the originally written data set), the resulting decoded output is provided as an output codeword 172 to a de-interleaver circuit 180. De-interleaver circuit 180 rearranges the data to reverse both the global and local interleaving applied to the data to yield a de-interleaved output 182. De-interleaved output 182 is provided to a hard decision output circuit 190. Hard decision output circuit 190 is operable to re-order data sets that may complete out of order back into their original order. The originally ordered data sets are then provided as a hard decision output 192.

Turning to FIG. 2, a data encoding circuit 200 including code conversion circuitry is shown in accordance with various embodiments of the present invention. Data encoding system 200 includes an encoding circuit 220 that applies a parity check matrix to a user data set 205. User data set 205 may be any set of input data. For example, where data encoding circuit 200 is a hard disk drive, original input 205 may be a data set that is destined for storage on a storage medium. In such cases, a medium 240 of data encoding circuit 200 is a storage medium. As another example, where data processing system 200 is a communication system, user data set 205 may be a data set that is destined to be transferred to a receiver via a transfer or communication medium. Such transfer mediums may be, but are not limited to, wired, wireless, optical, or magnetic transfer mediums. A prepared parity check matrix is received by LDPC encoding circuit 220 from a block 210, and this prepared parity check matrix is used by LDPC encoding circuit 220 to encode user data set 205 to yield an LDPC codeword 225.

FIG. 3 shows an example LDPC codeword 300 such as that provided as an output from LDPC encoding circuit 220. It should be noted that LDPC codeword 300 is merely an example, and that based upon the disclosure provided herein, one of ordinary skill in the art will recognize other sizes (i.e., rows and/or columns) that LDPC codeword 300. As shown, LDPC codeword 300 is arranged as a number of circulants ($P_{i,j}$). Such circulants are matrices where each row vector is rotated one element to the right relative to the preceding row vector. Such circulants reduce the amount of processing that must be applied during a downstream data decoding process. An example of such a circulant is shown as circulant 305 where the element a is rotated through each successive row of thereof. In this case, circulant 305 is a p×p circulant with a weight of one which may be referred to as a permutation matrix. In a binary LDPC code, $\alpha$ is $\alpha$ is a value $2^q$, where q is equal to one (1). In a non-binary LDPC code, $\alpha$ is a value $2^q$, where q is greater than one (1).

Returning to FIG. 2, LDPC codeword 225 is provided to a codeword conversion circuit 290 that converts the circulants of LDPC codeword 225 into a number of sub-circulants. This converted codeword is provided as a hardware flexible codeword 295. FIG. 4 graphically depicts an example LDPC codeword conversion. Beginning with an example circulant 400 corresponding to an element of LDPC codeword 225, a row and column permutation table is calculated in accordance with the following equation:

$$\text{Permutation Index}(i) = \text{mod}(i,s) * (p/s) + \text{floor}(i/s), \text{ for } i=0 \text{ to } p-1,$$

p is the size of the original circulant (i.e., the size of example circulant 400 is 4×4), and s is the number of desired sub-circulants. In some embodiments of the present invention, the value of s is user programmable, and in other embodiments of the present invention the value of s is fixed. In this example of FIG. 4, s is equal to two (2). S is typically equally divisible into p. In this case, the permutation index values are calculated in accordance with the following equations:

$$\text{Permutation Index}(0) = \text{mod}(0,2) * (4/2) + \text{floor}(0/2) = 0*2+0=0;$$

$$\text{Permutation Index}(1) = \text{mod}(1,2) * (4/2) + \text{floor}(1/2) = 1*2+0=2;$$

$$\text{Permutation Index}(2) = \text{mod}(2,2) * (4/2) + \text{floor}(2/2) = 0*2+1=1; \text{ and}$$

$$\text{Permutation Index}(3) = \text{mod}(3,2) * (4/2) + \text{floor}(0/2) = 1*2+1=3.$$

These permutation indices are then used to swap rows in example circulant 400 to yield row permutation circulant 420. In particular, row zero of circulant 400 becomes row zero of row permutation circulant 420 (i.e., permutation index(0)=0); row one of circulant 400 becomes row two of row permutation circulant 420 (i.e., permutation index(1)=2); row two of circulant 400 becomes row one of row permutation circulant 420 (i.e., permutation index(2)=1); and row three of circulant 400 becomes row three of row permutation circulant 420 (i.e., permutation index(3)=3).

Next, the calculated permutation indices are used to swap columns of row permutation circulant 420 to yield a column permutation circulant 440. In particular, column zero of row permutation circulant 420 becomes column zero of column permutation circulant 440 (i.e., permutation index (0)=0); column one of row permutation circulant 420 becomes column two of column permutation circulant 440 (i.e., permutation index(1)=2); column two of row permutation circulant 420 becomes column one of column permutation circulant 440 (i.e., permutation index(2)=1); and column three of row permutation circulant 420 becomes column three of column permutation circulant 440 (i.e., permutation index(3)=3). As shown, this process of permuting the rows using the permutation indices followed by permuting the columns by the same permutation indices yields column permutation circulant 440 that has two circulants 454, 456 each of size s, and the remaining elements 452, 458 as zero elements. Circulant 454, 456 are referred to as sub-circulants. The term "sub-circulants" is used in its broadest sense to mean a circulant derived from a larger circulant. Converting circulant 400 into sub-circulants, allows for processing the sub-circulants (i.e., circulants 454, 456) in parallel which can be used to reduce the hardware complexity of a downstream data decoding circuit (see e.g., FIG. 1). Of note, the example of FIG. 4 shows permutation on a row by row basis followed by permutation on a column by column basis, however, it should be noted that the permutation may be done on a column by column basis followed by a row by row basis.

Returning to FIG. 2, LDPC codeword 225 with circulants converted to multiple sub-circulants as described in relation to FIG. 4 (i.e., an LDPC code with a number of column permutation circulants 440) is provided as hardware flexible codeword 295 to transmission circuit 230. This reforming of LDPC codeword 225 to include the divisible circulants including the sub-circulants (e.g., column permutation circulant 440) includes placing the respective divisible circulants into the order of the initial codeword (e.g., codeword 300). Transmission circuit 230 may be any circuit known in the art that is capable of transferring hardware flexible codeword 295 via medium 240. Thus, for example, where data encoding circuit 200 is part of a hard disk drive, transmission circuit 230 may include a read/write head assembly that converts an electrical signal into a series of magnetic signals appropriate for writing to a storage medium. Alternatively, where data encoding circuit 200 is part of a wireless communication system, transmission circuit 230 may include a wireless transmitter that converts an electrical signal into a radio frequency signal appropriate for transmission via a wireless transmission medium. Transmission circuit 230 provides a transmission output 235 to medium 240. In turn, medium 240 provides transmission output to a recipient (not shown).

Figure 5A:
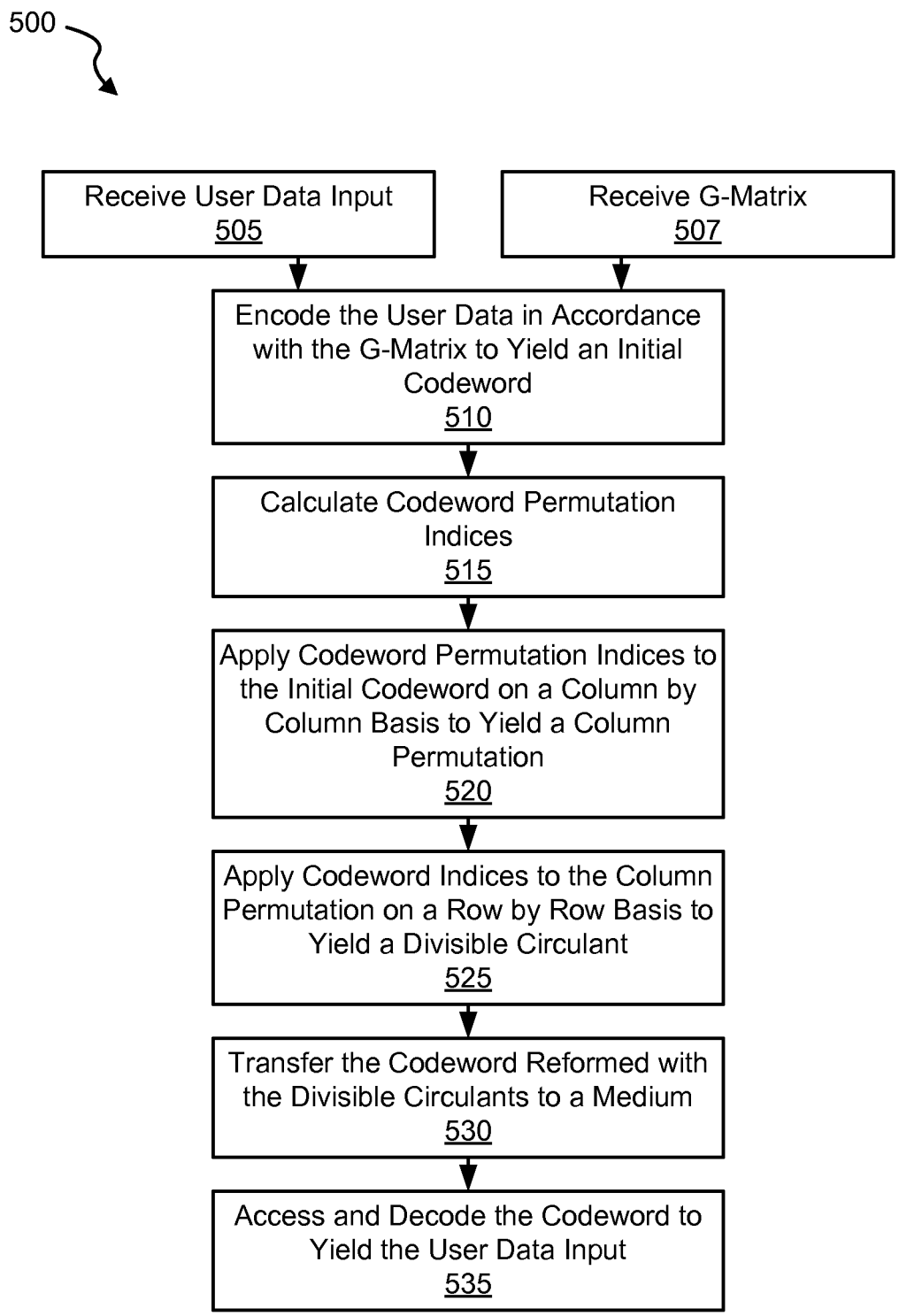
FIG. 5a is a flow diagram showing a method in accordance with one or more embodiments of the present invention for hardware flexible codeword conversion.

Turning to FIG. 5, a flow diagram 500 shows a method in accordance with one or more embodiments of the present invention for hardware flexible codeword conversion. Following flow diagram 500, a user data input is received (block 505). The user data input may be received from any number of devices known in the art. In some cases, the user data input is designed to be encoded and subsequently decoded. In some cases, the encoding yields a codeword that is transferred via a medium to a recipient device or circuit. In turn, the recipient device or circuit applies a decoding algorithm to the transferred codeword to derive the original user data set. In addition, a G-matrix (i.e., parity check generation matrix) is received (block 507). Te G-matrix may be any matrix or set of instructions known in the art that may be used by an encoder circuit for generating a codeword.

The received user data set is encoded in accordance with the G-matrix to yield an initial codeword (block 510). In one particular embodiment of the present invention, the encoding algorithm is an LDPC encoding algorithm as is known in the art, and the initial codeword is an initial LDPC codeword. As an example, the initial codeword may be similar to LDPC codeword 300 including circulants 305 as described above in relation to FIG. 3. It should be noted that other initial codewords are also possible. Codeword permutation indices are calculated for the initial codeword (block 515). The codeword permutation indices may be calculated in accordance with the following equation:

$$\text{Permutation Index}(i)=\text{mod}(i,s)*(p/s)+\text{floor}(i/s),\text{ for }i=0\text{ to }p-1,$$

p is the size of the original circulant, and s is the size of the desired circulant. The initial codeword is comprised of a number of circulants. Using an example circulant 550 of FIG. 5b as an example of the circulants included in the initial codeword where p is equal to six (6) and s is equal to two (2), the permutation index values are calculated in accordance with the following equations:

$$\text{Permutation Index}(0)=\text{mod}(0,2)*(6/2)+\text{floor}(0/2)$$
$$=0*3+0=0;$$

$$\text{Permutation Index}(1)=\text{mod}(1,2)*(6/2)+\text{floor}(1/2)$$
$$=1*3+0=3;$$

$$\text{Permutation Index}(2)=\text{mod}(2,2)*(6/2)+\text{floor}(2/2)$$
$$=0*3+1=1;$$

$$\text{Permutation Index}(3)=\text{mod}(3,2)*(6/2)+\text{floor}(3/2)$$
$$=1*3+1=4;$$

$$\text{Permutation Index}(4)=\text{mod}(4,2)*(6/2)+\text{floor}(4/2)$$
$$=0*3+2=2;\text{ and}$$

$$\text{Permutation Index}(5)=\text{mod}(5,2)*(6/2)+\text{floor}(5/2)$$
$$=1*3+2=5.$$

The calculated codeword permutation indices are applied to each of the circulants of the initial codeword on a column by column basis to yield a column permutation (block 520). An example column permutation 560 based upon example circulant 550 representing each of the circulants of the initial codeword is shown in FIG. 5b. In particular, column zero of circulant 550 becomes column zero of column permutation 560 (i.e., permutation index(0)=0); column one of circulant 550 becomes column three of column permutation 560 (i.e., permutation index(1)=3); column two of circulant 550 becomes column one of column permutation 560 (i.e., permutation index(2)=1); column three of circulant 550 becomes column four of column permutation 560 (i.e., permutation index(3)=4); column four of circulant 550 becomes column two of column permutation 560 (i.e., permutation index(4)=2); and column five of circulant 550 becomes column five of column permutation 560 (i.e., permutation index(5)=5).

Next, the calculated codeword permutation indices are applied to each of the column permutations of the initial codeword on a row by row basis to yield a divisible circulant (block 525). An example divisible circulant 570 based upon example circulant 550 representing each of the circulants of the initial codeword is shown in FIG. 5b. In particular, row zero of column permutation 560 becomes row zero of divisible circulant 570 (i.e., permutation index(0)=0); row one of circulant 550 becomes row three of divisible circulant 570 (i.e., permutation index(1)=3); row two of circulant 550 becomes row one of divisible circulant 570 (i.e., permutation index(2)=1); row three of circulant 550 becomes row four of divisible circulant 570 (i.e., permutation index(3)=4); row four of circulant 550 becomes row two of divisible circulant 570 (i.e., permutation index(4)=2); and row five of circulant 550 becomes row five of divisible circulant 570 (i.e., permutation index(5)=5). Of note, two (i.e., the value of s) circulants 554, 556 remain along with two zero elements 552, 558. Circulants 554, 556 are referred to as sub-circulants. Converting circulant 550 into sub-circulants 554, 556, allows for processing the sub-circulants in parallel which can be used to reduce the hardware complexity of a downstream data decoding circuit (see e.g., FIG. 1). Of note, the example of FIG. 5b shows permutation on a column by column basis followed by permutation on a row by row basis, however, it should be noted that the permutation may be done on a row by row basis followed by a column by column basis. The initial codeword reformed by the processes of blocks 520, 530 to include the divisible circulants is then transferred to a medium (block 530) from which it is received or accessed and decoded to yield the original user data input (block 535). Reforming the initial codeword to include the divisible circulants includes placing the respective divisible circulants into the order of the initial codeword (e.g., codeword 300).

Figure 6:
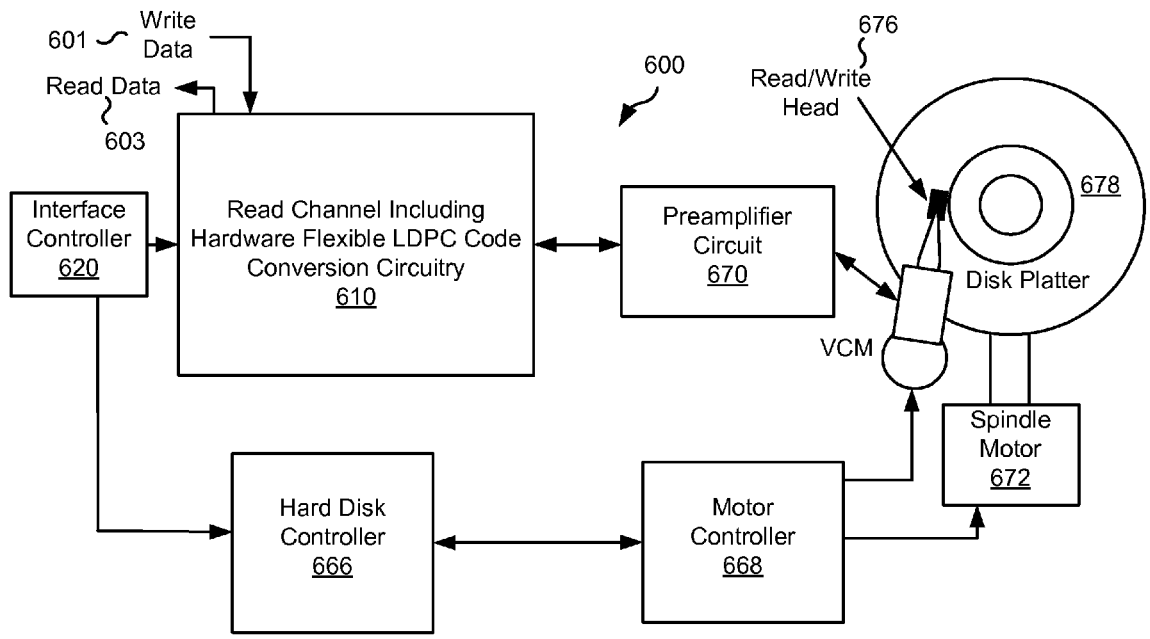
FIG. 6 depicts a data processing circuit having hardware flexible LDPC code conversion circuitry in accordance with some embodiments of the present invention.

Turning to FIG. 6, a storage system 600 having hardware flexible LDPC code conversion circuitry is shown in accordance with some embodiments of the present invention. Storage system 600 may be, for example, a hard disk drive. Storage system 600 also includes a preamplifier 670, an interface controller 620, a hard disk controller 666, a motor controller 668, a spindle motor 672, a disk platter 6178, and a read/write head assembly 676. Interface controller 620 controls addressing and timing of data to/from disk platter 678. The data on disk platter 678 consists of groups of magnetic signals that may be detected by read/write head assembly 676 when the assembly is properly positioned over disk platter 678. In one embodiment, disk platter 678 includes magnetic signals recorded in accordance with either a longitudinal or a perpendicular recording scheme.

In a typical read operation, read/write head assembly 676 is accurately positioned by motor controller 668 over a desired data track on disk platter 678. Motor controller 668 both positions read/write head assembly 676 in relation to disk platter 678 and drives spindle motor 672 by moving read/write head assembly to the proper data track on disk platter 678 under the direction of hard disk controller 666. Spindle motor 672 spins disk platter 678 at a determined spin rate (RPMs). Once read/write head assembly 678 is positioned adjacent the proper data track, magnetic signals representing data on disk platter 678 are sensed by read/write head assembly 676 as disk platter 678 is rotated by spindle motor 672. The sensed magnetic signals are provided as a continuous, minute analog signal representative of the magnetic data on disk platter 678. This minute analog signal is transferred from read/write head assembly 676 to read channel circuit 610 via preamplifier 670. Preamplifier 670 is operable to amplify the minute analog signals accessed from disk platter 678. In turn, read channel circuit 610 decodes and digitizes the received analog signal to recreate the information originally written to disk platter 678. This data is provided as read data 603 to a receiving circuit. A write operation involves encoding a data set received as read data 603 to be a LDPC codeword in a hardware flexible format. The hardware flexible codeword is then transferred by read channel circuit 610 to disk platter 678 via preamplifier circuit 670.

During operation, user data is received by read channel circuit 610 and is encoded as a LDPC codeword using a prepared parity check matrix (e.g., a G-matrix). The resulting LDPC codeword is converted into a hardware flexible format to yield a hardware flexible codeword. The hardware flexible codeword is then transferred to disk platter 678 via preamplifier circuit 670. In turn, read channel circuit 610 accesses the previously stored hardware flexible codeword from disk platter 678 via preamplifier circuit 670, and decodes the received hardware flexible codeword to yield the original user data set. In some embodiments of the present read cannel circuit 610 may be implemented similar to that discussed above in relation to FIG. 1, and/or may operate similar to that discussed above in relation to FIG. 5.

It should be noted that storage system 600 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 600, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 610 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 7:
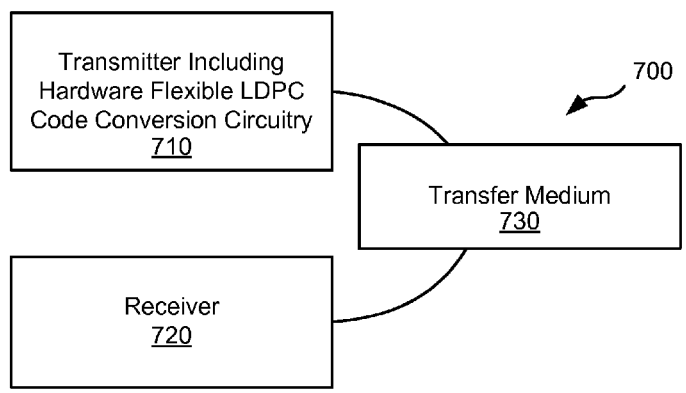
FIG. 7 shows a data transmission system including a transmitter having hardware flexible LDPC code conversion circuitry in accordance with some embodiments of the present invention.

Turning to FIG. 7, a data transmission system 700 including a transmitter 710 having hardware flexible LDPC code conversion circuitry is shown in accordance with some embodiments of the present invention. Data transmission system 700 includes transmitter 710 that is operable to receive and encode a user data set into an LDPC codeword, and to convert the LDPC codeword into a hardware flexible codeword. Transmitter 710 transfers the hardware flexible codeword to a receiver 720 via a transfer medium 730 as is known in the art. Transfer medium may be any medium known in the art operable to transfer information. Such a transfer medium may be, but is not limited to, a wired transfer medium, a magnetic storage medium, an optical medium, or a RF transfer medium. Based upon the disclosure provided herein, one of ordinary skill in the art will recognize a variety of transfer mediums that may be used in relation to different embodiments of the present invention.

During operation, user data is received by transmitter 710 and is encoded as a LDPC codeword using a prepared parity check matrix (e.g., a G-matrix). The resulting LDPC codeword is converted into a hardware flexible format to yield a hardware flexible codeword. The hardware flexible codeword is then transferred to receiver 720 via transfer medium 730. In turn, receiver 720 decodes the received hardware flexible codeword to yield the original user data set. In some embodiments of the present invention, transmitter 710 may be implemented similar to that discussed above in relation to FIG. 2, and/or may operate similar to that discussed above in relation to FIG. 5.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data encoding system, the system comprising:
    a data encoder circuit operable to apply an encoding algorithm to a data set to yield an initial codeword, wherein the initial codeword includes at least one initial circulant;
    a codeword conversion circuit operable to rearrange elements of the initial circulant to yield a divisible circulant including a selected number of sub-circulants, and to reform the initial codeword to include the divisible circulant to yield a converted codeword.

2. The system of claim 1, wherein the selected number of sub-circulants is programmable.

3. The system of claim 1, wherein the selected number of sub-circulants is fixed.

4. The system of claim 1, wherein the codeword conversion circuit is further operable to determine codeword permutation indices based at least in part on the selected number of sub-circulants.

5. The system of claim 4, wherein the codeword permutation indices are calculated in accordance with the following equation:

$$\text{Permutation Index}(i) = \mod(i,s)*(p/s) + \text{floor}(i/s), \text{ for } i=0 \text{ to } p-1,$$

wherein p is the size of the initial circulant, and s is the selected number of sub-circulants.

6. The system of claim 4, wherein rearranging the elements of the initial circulant to yield the divisible circulant including a selected number of sub-circulants is done by swapping rows of the initial circulant in accordance with the permutation indices to yield an interim data set.

7. The system of claim 6, wherein rearranging the elements of the initial circulant to yield the divisible circulant including a selected number of sub-circulants further includes swapping columns of the interim data set in accordance with the permutation indices to yield the divisible circulant.

8. The system of claim 4, wherein rearranging the elements of the initial circulant to yield the divisible circulant including a selected number of sub-circulants is done by swapping columns of the initial circulant in accordance with the permutation indices to yield an interim data set.

9. The system of claim 8, wherein rearranging the elements of the initial circulant to yield the divisible circulant including a selected number of sub-circulants further includes swapping rows of the interim data set in accordance with the permutation indices to yield the divisible circulant.

10. The system of claim 1, wherein the encoding algorithm is a low density parity check encoding algorithm.

11. A method for codeword conversion, the method comprising:
    applying a data encoding algorithm to a data set to yield an initial codeword, wherein the initial codeword includes at least one initial circulant;
    rearranging elements of the initial circulant to yield a divisible circulant including a selected number of sub-circulants; and
    reforming the initial codeword to include the divisible circulant to yield a converted codeword.

12. The method of claim 11, wherein the method further comprises determining codeword permutation indices based at least in part on the selected number of sub-circulants.

13. The method of claim 11, wherein the codeword permutation indices are calculated in accordance with the following equation:

$$\text{Permutation Index}(i) = \mod(i,s)*(p/s) + \text{floor}(i/s), \text{ for } i=0 \text{ to } p-1,$$

wherein p is the size of the initial circulant, and s is the selected number of sub-circulants.

14. The method of claim 11, wherein rearranging the elements of the initial circulant to yield the divisible circulant including a selected number of sub-circulants is done by swapping rows of the initial circulant in accordance with the permutation indices to yield an interim data set.

15. The method of claim 14, wherein rearranging the elements of the initial circulant to yield the divisible circulant including a selected number of sub-circulants further includes swapping columns of the interim data set in accordance with the permutation indices to yield the divisible circulant.

16. The method of claim 11, wherein rearranging the elements of the initial circulant to yield the divisible circulant including a selected number of sub-circulants is done by swapping columns of the initial circulant in accordance with the permutation indices to yield an interim data set.

17. The method of claim 16, wherein rearranging the elements of the initial circulant to yield the divisible circulant including a selected number of sub-circulants further includes swapping rows of the interim data set in accordance with the permutation indices to yield the divisible circulant.

18. The method of claim 11, wherein the data encoding algorithm is a low density parity check encoding algorithm.

19. A storage device, the storage device comprising:
    a data encoder circuit operable to apply an encoding algorithm to a data set to yield an initial codeword, wherein the initial codeword includes at least one initial circulant;
    a codeword conversion circuit operable to rearrange elements of the initial circulant to yield a divisible circulant including a selected number of sub-circulants, and to reform the initial codeword to include the divisible circulant to yield a converted codeword;
    a transmission circuit operable to store the converted codeword to a storage medium;
    a processing circuit operable to receive the converted codeword from the storage medium and to generate the data set from the converted codeword.

20. The storage device of claim 19, wherein the encoding algorithm is a low density parity check encoding algorithm, and wherein the processing circuit includes a low density parity check data decoding circuit.

* * * * *